United States Patent
Lin et al.

(10) Patent No.: US 12,085,866 B2
(45) Date of Patent: *Sep. 10, 2024

(54) PARTICLE REMOVING ASSEMBLY AND METHOD OF CLEANING MASK FOR LITHOGRAPHY

(71) Applicant: TAIWAN SEMICONDUCTOR MANUFACTURING COMPANY, LTD., Hsinchu (TW)

(72) Inventors: Chen-Yang Lin, Zhudong Township (TW); Da-Wei Yu, Hsinchu (TW); Li-Hsin Wang, Taipei (TW); Kuan-Wen Lin, Taichung (TW); Chia-Jen Chen, Jhudong Township (TW); Hsin-Chang Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/200,951

(22) Filed: May 23, 2023

(65) Prior Publication Data
US 2023/0314963 A1    Oct. 5, 2023

Related U.S. Application Data

(63) Continuation of application No. 17/713,012, filed on Apr. 4, 2022, now Pat. No. 11,698,592, which is a
(Continued)

(51) Int. Cl.
G03F 7/00 (2006.01)
G03F 1/22 (2012.01)
G03F 1/82 (2012.01)

(52) U.S. Cl.
CPC ............ G03F 7/70925 (2013.01); G03F 1/22 (2013.01); G03F 1/82 (2013.01)

(58) Field of Classification Search
CPC .......... G03F 7/70925; G03F 1/22; G03F 1/82; G03F 7/70341
See application file for complete search history.

(56) References Cited

U.S. PATENT DOCUMENTS 6,949,147 B2    9/2005  Uziel et al.
8,585,391 B2    11/2013 Kim et al.
(Continued)

OTHER PUBLICATIONS

Non-Final Office Action issued in U.S. Appl. No. 17/085,206 dated Sep. 20, 2021.
(Continued)

*Primary Examiner* — Hung V Nguyen
(74) *Attorney, Agent, or Firm* — STUDEBAKER & BRACKETT PC (57) ABSTRACT

A photolithographic apparatus includes a particle removing cassette, a pump and a compressor. The particle removing cassette includes a first slit that includes an array of parallel wind blade nozzles arranged along a length of the first slit, protruding from the first slit, and configured to eject and direct pressurized cleaning material to a patterning surface of a mask to remove debris particles on the patterning surface. The pump and the compressor are controlled by a controller to adjust a flow rate and a pressure of the pressurized cleaning material based on an amount of debris particles on the patterning surface of the mask.

20 Claims, 10 Drawing Sheets

Related U.S. Application Data continuation of application No. 17/085,206, filed on Oct. 30, 2020, now Pat. No. 11,294,292.

(60) Provisional application No. 62/955,351, filed on Dec. 30, 2019.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 10,831,115 B1 * | 11/2020 | Moon ................ G03F 1/84 |
| 11,294,292 B2 | 4/2022 | Lin et al. |
| 11,446,713 B2 | 9/2022 | Iwamoto et al. |
| 11,698,592 B2 * | 7/2023 | Lin ................ G03F 1/22 |
| | | 355/30 |
| 2002/0083957 A1 | 7/2002 | Reid |
| 2011/0037960 A1 | 2/2011 | Scaccabarozzi et al. |
| 2014/0230848 A1 | 8/2014 | Yamauchi et al. |
| 2015/0000070 A1 | 1/2015 | Liu et al. |
| 2016/0214149 A1 | 7/2016 | Chiang et al. |
| 2020/0035483 A1 | 1/2020 | Huang et al. |

OTHER PUBLICATIONS

Notice of Allowance issued in U.S. Appl. No. 17/085,206 dated Dec. 7, 2021.
Non-Final Office Action issued in U.S. Appl. No. 17/713,012, dated Oct. 14, 2022.
Notice of Allowance issued in U.S. Appl. No. 17/713,012, dated Feb. 23, 2023.

* cited by examiner

PARTICLE REMOVING ASSEMBLY AND METHOD OF CLEANING MASK FOR LITHOGRAPHY

PRIORITY CLAIM AND CROSS-REFERENCE

This application is a continuation of U.S. application Ser. No. 17/713,012 filed on Apr. 4, 2022, which is a continuation of U.S. application Ser. No. 17/085,206 filed on Oct. 30, 2020, now U.S. Pat. No. 11,294,292, which claims priority to U.S. Provisional Application No. 62/955,351 filed on Dec. 30, 2019, the entire disclosure of both applications are incorporated herein by reference.

BACKGROUND

Debris particles can reduce the yield of photolithography operations by undesirably shielding portions of a mask pattern. It is, therefore, desirable to maintain a clean environment in locations and routes where masks pass through during the lithography process such as tool grippers, chambers, mask holders, etc. In particular, the ability to produce high quality microelectronic devices and reduce yield losses is dependent upon maintaining the surfaces of critical components substantially defect-free. This would include maintaining the surfaces free of contaminants, e.g., maintaining an ultra-clean surface ensuring that contaminants are not deposited on the surface of the wafer, the reticle or mask or other critical components. This is of particular concern as finer features are required on the microelectronic device. The types of contaminants can be any arbitrary combination depending on the environment and the vacuum condition. The contaminants could be introduced from operations, such as etching byproducts in the mask making process, organic hydrocarbon contaminants, any kind of fall-on dust, outgassing from steel, and so on.

Photolithographic equipment is cleaned using a vacuum and an isopropyl alcohol/ethanol wipe-down, and particle counters are used to monitor and verify cleanliness. However, such manual cleaning may not be preferable for vacuum chambers. Moreover, wipe-down and/or vacuum cleaning of delicate or small components is not desirable. Additionally, these procedures are not specific to locations and routes through which masks would pass or potentially get contaminated. Thus, alternate methods of maintaining cleanliness of the masks are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure relates to a contaminant particle removing cassette that is designed to remove contaminants to improve cleanliness of masks.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL, an increase in wafer exposure throughput is desirable. Wafer exposure throughput can be improved through increased exposure power or increased resist photospeed (sensitivity).

Metal-containing photoresists are used in extreme ultraviolet (EUV) lithography because metals have a high absorption capacity of extreme ultraviolet radiation and thus increase the resist photospeed. Metal-containing photoresist layers, however, may outgas during processing which can cause the photoresist layer quality to change over time and may cause contamination, thereby negatively affecting lithography performance and increasing defects.

Figure 1:
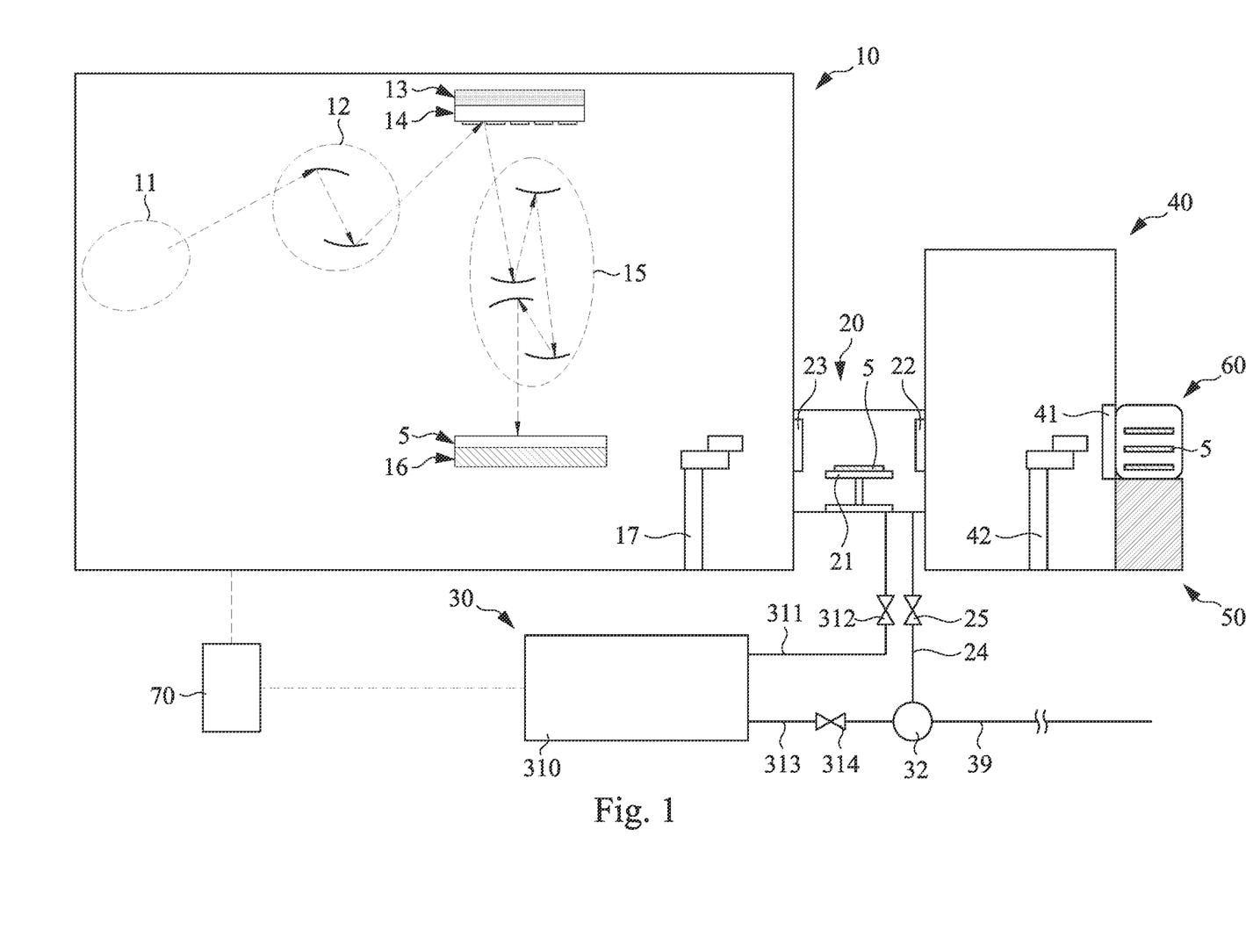
FIG. 1 shows a schematic view of a semiconductor wafer processing system, in accordance with some embodiments.

FIG. 1 is a schematic view of a semiconductor wafer processing system, in accordance with some embodiments. In some embodiments, the semiconductor wafer processing system includes a processing apparatus 10, a load lock chamber 20, a pressure adjusting module 30, an interface module 40, one or more load ports 50, one or more carriers 60, and a controller 70, in accordance with some embodiments. It should be appreciated that the features described below can be replaced or eliminated in other embodiments of the semiconductor wafer processing system.

In some embodiments, the processing apparatus 10 includes a light source 11, an illuminator 12, a mask stage 13, a mask 14, a projection optics module 15, a substrate stage 16, and a wafer transfer member 17, in accordance with some embodiments. The elements of the processing apparatus 10 can be added to or omitted, and the disclosure should not be limited by the embodiment.

The light source 11 is configured to generate radiation having a wavelength ranging between about 1 nm and about 300 nm in some embodiments. In one particular example, the light source 11 generates EUV light with a wavelength centered at about 13.5 nm. Accordingly, the light source 11 is also referred to as an EUV light source in some embodiments. However, it should be appreciated that the light source 11 should not be limited to emitting EUV light. The light source 11 can be the other light sources including deep UV, such as an ArF or KrF laser.

In various embodiments, the illuminator 12 includes various refractive optic components, such as a single lens or a lens system having multiple lenses (zone plates) or alternatively reflective optics (for EUV lithography system), such as a single mirror or a mirror system having multiple mirrors in order to direct light from the light source 11 onto a mask stage 13, particularly to the mask 14 secured on the mask stage 13. In the present embodiment where the light source 11 generates light in the EUV wavelength range, reflective optics are employed.

The mask stage 13 is configured to secure the mask 14. In some embodiments, the mask stage 13 includes an electrostatic chuck (e-chuck) to secure the mask 14. This is because the gas molecules absorb EUV light and the lithography system for the EUV lithography patterning is maintained in a vacuum environment to avoid EUV intensity loss. In the present disclosure, the terms mask and reticle are used interchangeably.

In the present embodiment, the mask 14 is a reflective mask. One exemplary structure of the mask 14 includes a substrate with a suitable material, such as a low thermal expansion material (LTEM) or fused quartz. In various examples, the LTEM includes $TiO_2$ doped $SiO_2$, or other suitable materials with low thermal expansion. The mask 14 includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 14 may further include a capping layer, such as ruthenium (Ru), disposed on the ML for protection. The mask 14 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The projection optics module (or projection optics box (POB)) 15 is configured for imaging the pattern of the mask 14 onto a semiconductor wafer 5 secured on a substrate stage 16 of the processing apparatus 10. In some embodiments, the POB 15 has refractive optics (such as for a UV lithography system) or alternatively reflective optics (such as for an EUV lithography system) in various embodiments. The light directed from the mask 14, carrying the image of the pattern defined on the mask, is collected by the POB 15. The illuminator 12 and the POB 15 are collectively referred to as an optical module of the processing apparatus 10.

The wafer transfer member 17 is configured to deliver the semiconductor wafer 5 from one location within the processing apparatus 10 to another. For example, the semiconductor wafer 5 located in the load lock chamber 20 is transferred to the substrate stage 16 by the wafer transfer member 17. A radial and rotational movement of the wafer transfer member 17 can be coordinated or combined in order to pick up, transfer, and deliver the semiconductor wafer 5.

In the present embodiment, the semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 5 may be a silicon-on-insulator (SOI) or a germanium-on-insulator (GOI) substrate.

In addition, the semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor wafer 5 is coated with a resist layer that is sensitive to EUV light. Various components including those described above are integrated together and are operable to perform the lithographic exposing operations.

It should be appreciated that while the processing apparatus 10 is a lithography module, the embodiments of the disclosure should not be limited thereto. The processing apparatus 10 may be configured to perform any manufacturing procedure on a semiconductor wafer 5. For example, the processing apparatus 10 may be configured to perform manufacturing procedures that include deposition processes such as physical vapor deposition (PVD), chemical vapor deposition (CVD), plasma-enhanced chemical vapor deposition (PECVD) and/or other deposition processes. Alternatively, the processing apparatus 10 may be configured to perform manufacturing procedures that include etching processes such as wet etching, dry etching or ion beam milling. Also, the processing apparatus 10 may be configured to perform manufacturing procedures that include lithographic exposure, ion implantation, thermal processes, cleaning processes, testing, any procedure involved in the processing of the semiconductor wafer 5, and/or any combination of such procedures.

The load lock chamber 20 is arranged between the processing apparatus 10 and the interface module 40. The load lock chamber 20 is configured to preserve the atmosphere within the processing apparatus 10 by separating it from the interface module 40. In some embodiments, the load lock chamber 20 includes a wafer stage 21, an external door 22 and an interior door 23. When the semiconductor wafer 5 is inserted into the load lock chamber 20, the semiconductor wafer 5 is placed on the wafer stage 21, and the external door 22 and the interior door 23 are sealed. As a result, an air-tight environment is built in the load lock chamber 20.

The load lock chamber 20 is capable of creating an atmosphere compatible with the processing apparatus 10 or the interface module 40 depending on where the loaded semiconductor wafer 5 is scheduled to be next. This can be performed by altering the gas content of the load lock chamber 20 by adding gas or creating a vacuum, along with other suitable means, using such mechanisms as the pressure adjusting module 30, for adjusting atmosphere in the load lock chamber 20. When the correct atmosphere has been reached, the semiconductor wafer 5 can be accessed.

The pressure adjusting module 30 is configured to reduce the pressure of gas in the load lock chamber 20. In some embodiments, the pressure adjusting module 30 includes a gas tank 310 and a pumping assembly 32. In some embodiments, the volume of the gas tank 310 is greater than the volume of a space defined in the load lock chamber 20 for receiving the semiconductor wafer 5. In some embodiments, the volume of the gas tank 310 is about 15 to about 20 times the volume of the load lock chamber 20. As such, a pressure drop occurs in the load lock chamber 20, when a low pressure gas is contained in the gas tank 310 and an exchange of gas between the gas tank and the load lock chamber 20 is enabled.

In some embodiments, the gas tank 310 is connected to the load lock chamber 20 via the gas line 311. A valve 312 is positioned on the gas line 311 for controlling the flow of gas in the gas line 311. In addition, the gas tank 310 is connected to the pumping assembly 32 via the gas line 313. A valve 314 is positioned on the gas line 313 for controlling the flow of gas in the gas line 313. Moreover, the pumping assembly 32 is connected to the load lock chamber 20 via a gas line 24. A valve 25 is connected to the gas line 24 for controlling the flow of gas in the gas line 24.

In some embodiments, the interface module 40 is a facility interface. In some embodiments, the load port 50 is adjacent to the interface module 40. In some embodiments, an overhead hoist transport (OHT) (not shown) transports the carrier 60, such as a standard mechanical interface (SMIF) or a front opening unified pod (FOUP) with the semiconductor wafer 5 from a stocker (not shown) to the load port 50.

In some embodiments, the interface module 40 includes a wafer transfer member 42 for delivering the semiconductor wafer 5 from one location within the processing interface module 40 to another. For example, when the carrier 60 is located on the load port 50, the semiconductor wafer 5 in the carrier 60 is transferred to the load lock chamber 20 by the wafer transfer member 42. A radial and rotational movement of the wafer transfer member 42 can be coordinated or combined in order to pick up, transfer, and deliver the semiconductor wafer 5.

The controller 70 is configured to control the operation of the semiconductor wafer processing system 1. In some embodiments, the controller 70 includes a computer integrated manufacturing (CIM) host and is electrically connected to all elements of the semiconductor wafer processing system 1. For example, the controller 70 is electrically connected to the pumping assembly 32, the valve 25 and the valves 312 and 314 of the pressure adjusting module 30 and controls the operation of the pumping assembly 32, the valve 25 and the valves 312 and 314 of the pressure adjusting module 30.

In order to transfer the semiconductor wafer 5 into the load lock chamber 20, the exterior door 22 is opened, and the interior door 23 is closed to isolate the load lock chamber 20 from other components of the processing apparatus 10. Afterwards, the semiconductor wafer 5 is inserted into the load lock chamber 20 through the exterior door 22 and placed on the wafer stage 21. After the semiconductor wafer 5 is placed in the load lock chamber 20, the exterior door 22 is closed to isolate the load lock chamber 20 from the interface module 40. As a result, an air-tight environment is maintained in the load lock chamber 20.

FIGS. 2A-2E show schematic diagrams of a semiconductor wafer process according to an embodiment of the disclosure. In some embodiments, the mask 14 is patterned by a procedure including photoresist coating and an e-beam exposure. After the e-beam exposure process, the resist material is further processed by a thermal baking process, referred to as a post exposure bake (PEB). Then, an inspection on the PEB process is followed. PR is a photoresist layer containing the resist material. TL is a target layer disposed over the substrate to be patterned according to the disclosed processes.

Figure 2A:
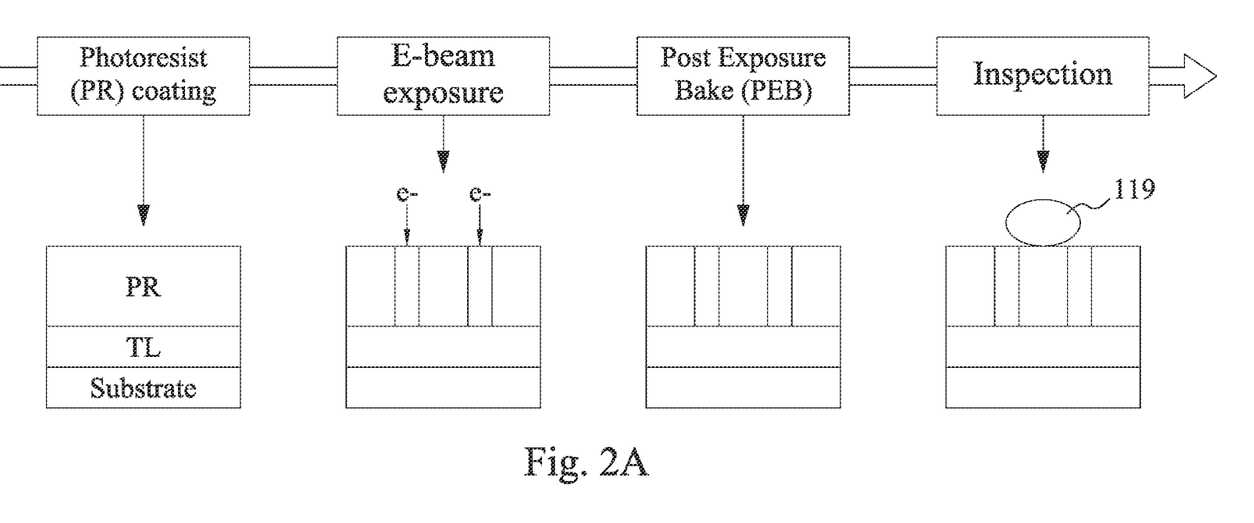
FIGS. 2A, 2B, 2C, 2D, and 2E show a schematic diagram of a semiconductor wafer process according to an embodiment of the disclosure.
Figure 2B:
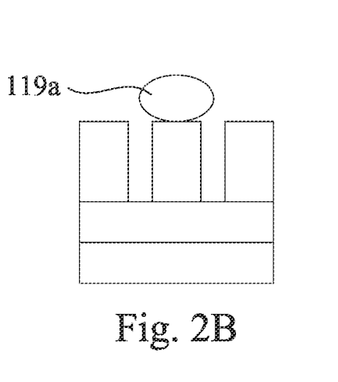
Figure 2C:
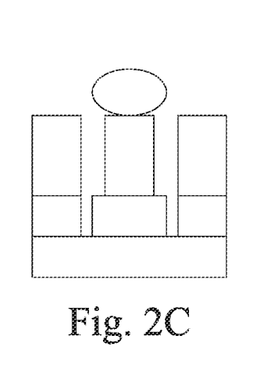
Figure 2D:
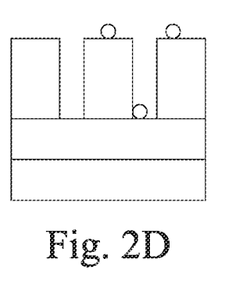
Figure 2E:
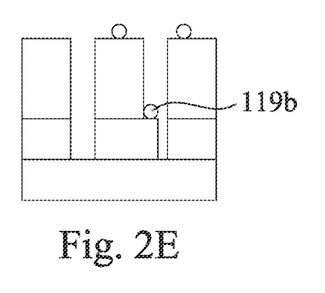

During the afore-mentioned processes, debris particles 119 can be released by the pod, or during transportation, e-beam writing, baking, developer and/or inspection. In some embodiments, larger debris particles 119a remain on a surface 120 of the mask 14, as shown in FIGS. 2B and 2C. As shown in FIG. 2C, the debris particles 119a interfere with subsequent processing, such as etching of the target layer TL. In other embodiments, smaller debris particles 119b are spread out over the photoresist pattern and the target layer, as shown in FIGS. 2D and 2E. As shown in FIG. 2E, the debris particles 119b interfere with subsequent processing, such as etching of the target layer. Photoresist rework to remove debris particles requires much time for photoresist re-coating and e-beam exposure. About 10~33 additional hours may be required to rework the photoresist. Proceeding with the development and etching operations with the particles present may produce defects.

Figure 3:
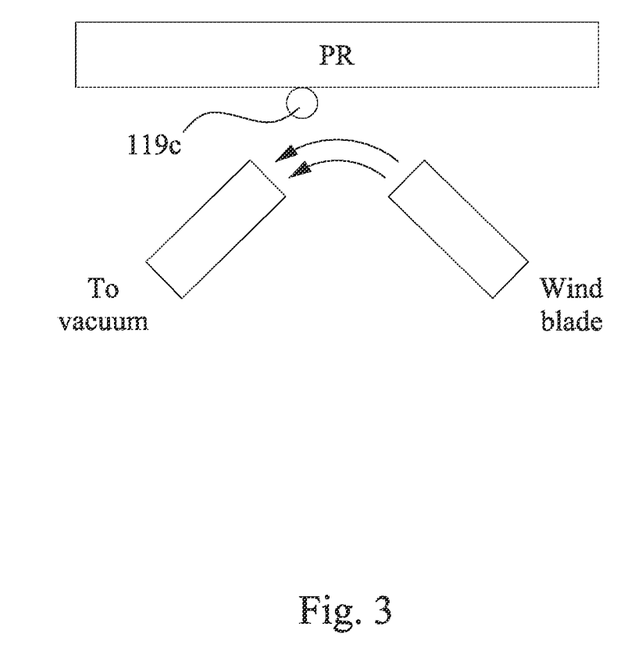
FIG. 3 shows an embodiment for removing debris particles.

FIG. 3 shows an embodiment for removing debris particles. The debris particles 119c are a metal particle, a resist particle or a particle of any material generally used in semiconductor manufacturing process such as, for example, silicon dioxide, silicon nitride, etc. Depending on the type of material and size of the debris particles 119c, the debris particles 119c adhere to the surface of the photoresist layer PR with varying adhesive forces.

The debris particles could be removed using a stick with a glue. However, a gap between the stick and the photoresist layer PR would be an issue because the gap is hard to control, and the debris particles may fall back on the patterning side of the mask. In some cases, the debris particles could be removed using an Atomic Force Microscopy (AFM). However, the process speed is slow for this method and the debris particles may fall back on the patterning side of the mask. The debris particles could be removed using a wind blade with a nozzle blowing air onto the patterning side with the mask facing up. However, the blowing air may cause the debris particles to spread out on the surface of the mask during the removal operation. Alternatively, debris particles could be removed using a vacuum with the patterning side of the mask facing up. However, the debris particles may fall back on the mask.

The method shown in FIG. 3 removes the debris particles 119c with the patterning side of the mask facing down such that debris particles do not spread out on the patterning side of the mask or fall back on the mask during the removal operation. The combination of the wind blade and vacuum process enhances the efficiency of the particles removal. In addition, there is no need to precisely locate the coordinate of debris particles because the full mask region can be processed. The debris particles can be removed without impacting photoresist quality.

Figure 4A:
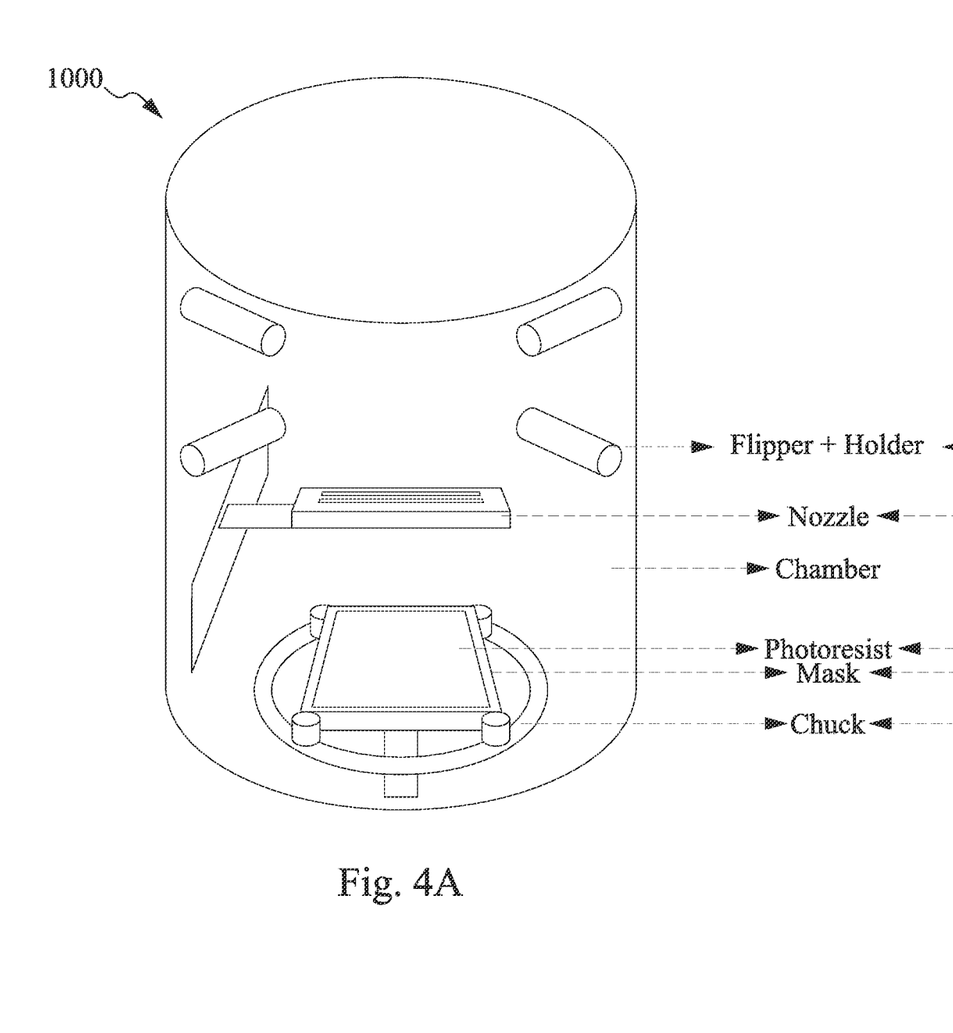
FIGS. 4A and 4B show detailed views of a particle removing assembly according to an embodiment of the disclosure.
Figure 4B:
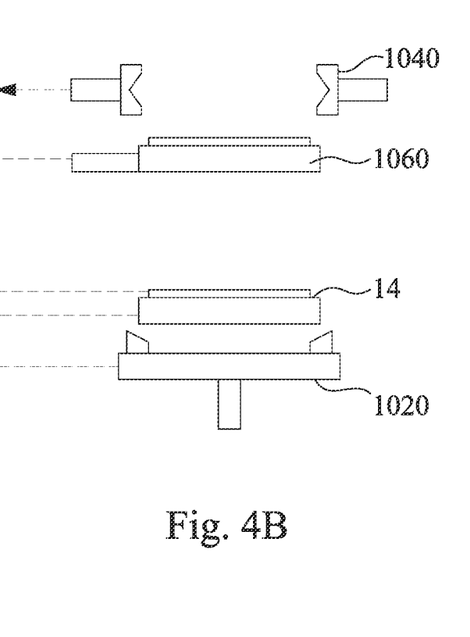

As shown in FIGS. 4A and 4B, the particle cleaning assembly 1000 includes a chuck assembly 1020, a holding and flipping member 1040 and a particle removing cassette 1060. The chuck assembly 1020 holds the mask 14 on which the debris particles are disposed.

Figure 5A:
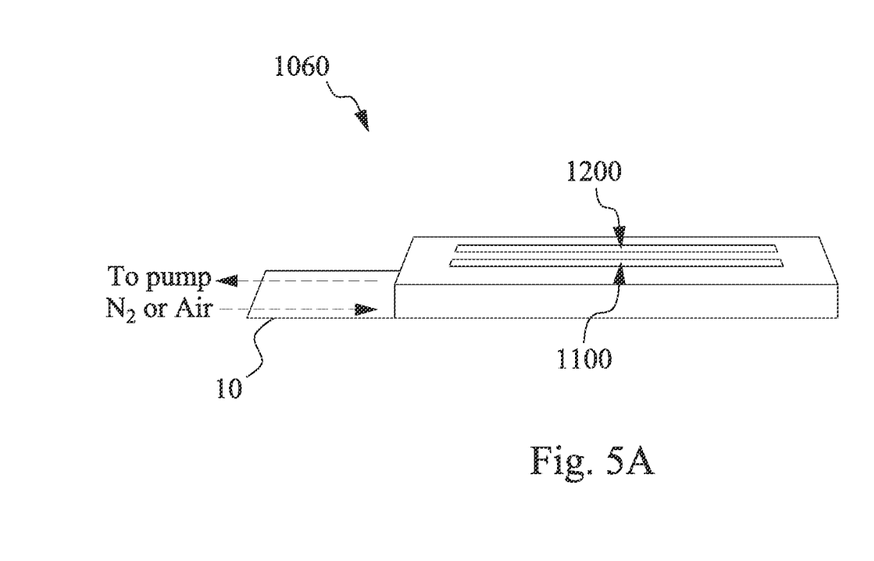
FIGS. 5A and 5B show detailed views of a particle removing cassette selectively extendable from the photolithographic apparatus according to an embodiment of the disclosure.
Figure 5B:
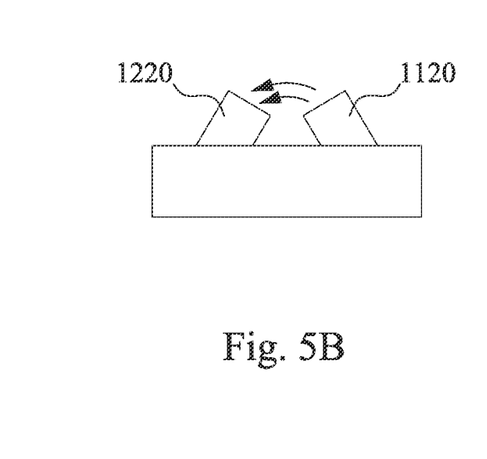

Referring to FIGS. 5A and 5B, the photolithographic apparatus 100 according to the present disclosure includes the particle removing cassette 1060 selectively extendable from the processing apparatus 10. In some embodiments, a wind blade slit 1100 includes an elongated wind blade nozzle 1120 and an exhausting slit 1200 including an elongated exhaust line 1220. FIG. 5A is an isometric view of the particle removing cassette 1060 and FIG. 5B is a cross section view of the particle removing cassette 1060.

Figure 6A:
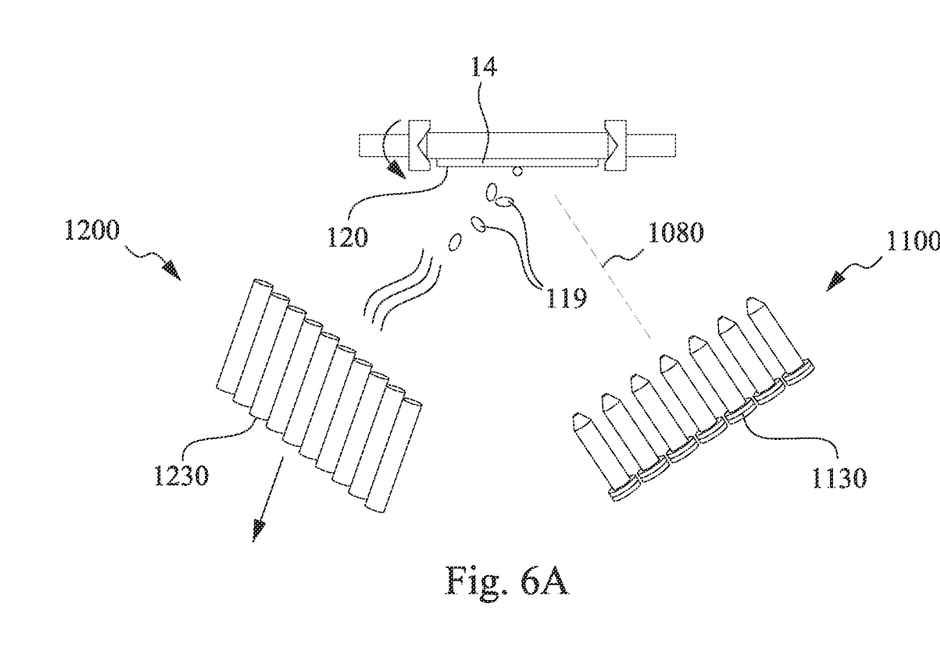
FIGS. 6A and 6B, show detailed views of an array of particle removing nozzles according to the present disclosure.
Figure 6B:
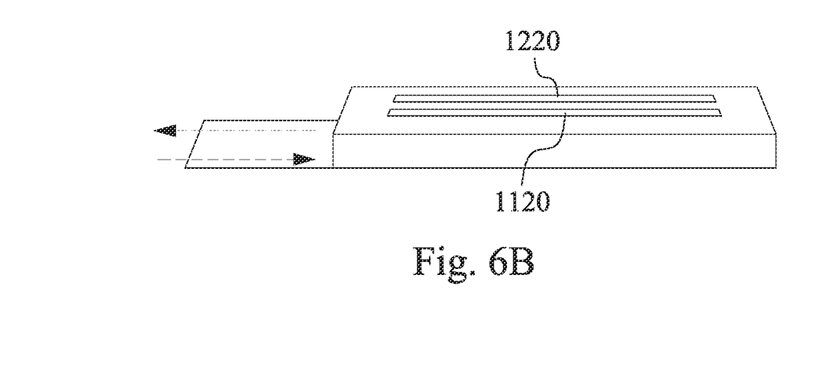

As also shown in FIGS. 6A and 6B, the particle removing cassette 1060 includes a wind blade slit 1100 and an exhausting slit 1200 from which pressurized cleaning material 1080 are introduced onto a surface 120 of the mask 14 to remove the debris particles 119 from the surface 120 of the mask 14. In some embodiments, the wind blade slit 1100 includes an array of wind blade nozzles 1130 spaced apart within the wind blade slit 1100, as shown in FIG. 6A. In some embodiments, a diameter of a wind blade nozzle is in a range of about 0.3 to about 0.5 cm. In some embodiments, a distance between the wind blade nozzles of the array of wind blade nozzles 1130 is in a range of about 0.5 to about 1 cm. In some embodiments, the exhausting slit 1200 includes an array of exhaust lines 1230 spaced apart within the exhausting slit 1200. The elongated wind blade nozzle 1120 is configured to direct pressurized cleaning material 1080 to a surface 120 of the mask 14 to remove the debris particles 119 from the surface 120 of the mask 14. In some embodiments, the pressure of the pressurized cleaning material 1080 is in a range of about 0.3 to about 0.6 Pascal. In some embodiments, a flow rate of the pressurized cleaning material 1080 is in a range of about 15 to about 50 liters per minute (LPM). The elongated exhaust line 1220 collects the debris particles 119 and contaminants separated from the surface 120 of the mask 14 through the exhaust line 1220. In some embodiments, a distance between the particle removing cassette and a patterning surface of the mask is in a range from 0.8 mm to 1.2 mm. In some embodiments, a distance between the wind blade slit and the exhaust slit is in a range from 8 mm to 12 mm.

Figure 7:
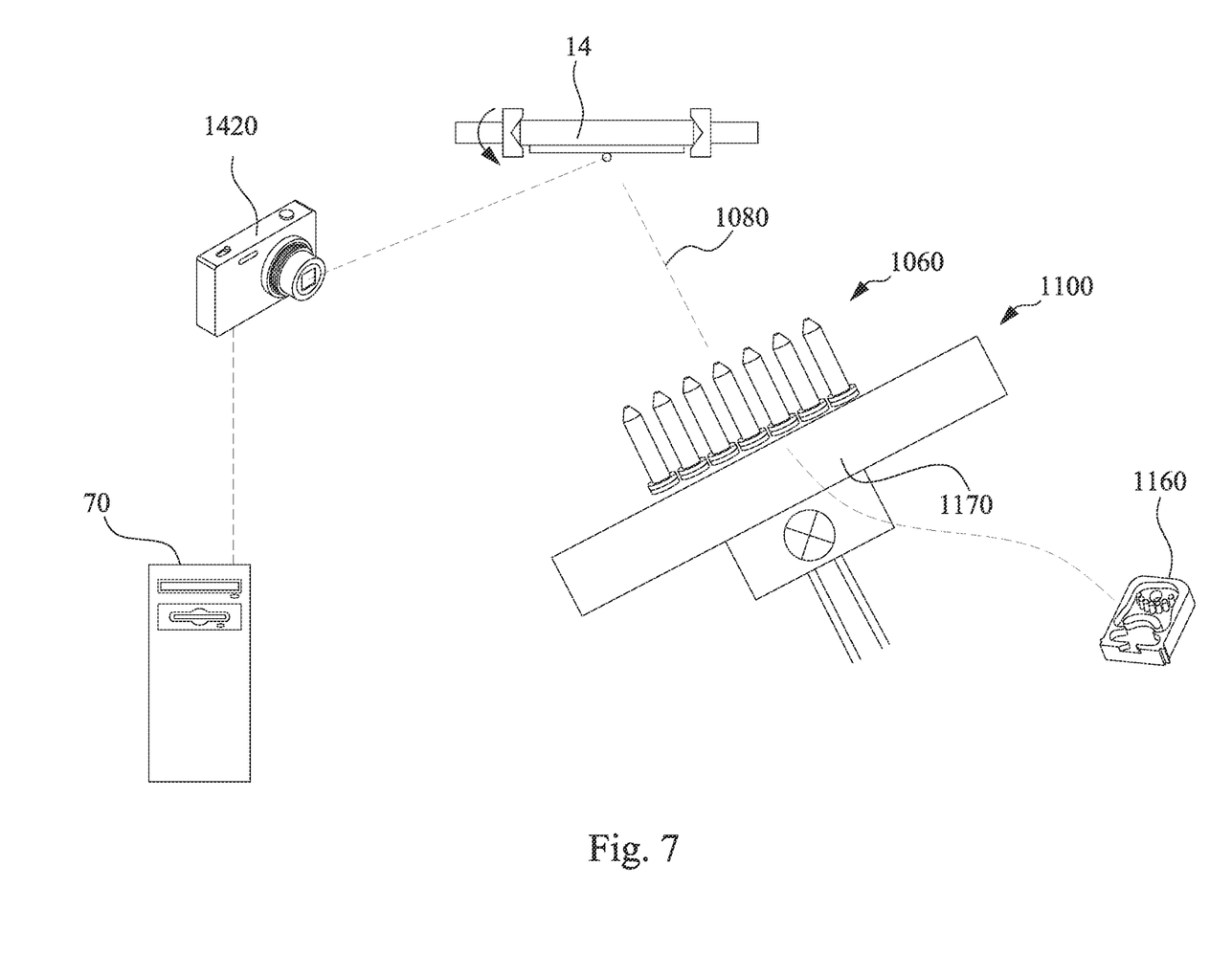
FIG. 7 shows a detailed view of a system for particle removing and inspecting according to an embodiment of the disclosure.

With respect to FIG. 7, in some embodiments, the wind blade slit 1100 further includes a pulsation insert 1160 inserted into the wind blade slit 1100, and a directional positioner 1170. The pulsation insert 1160 is configured to generate a pulsation/oscillation of the pressurized cleaning material 1080. The directional positioner 1170 is configured to change a two-dimensional direction and/or three-dimensional rotation of the pressurized cleaning material 1080. The directional positioner 1170 is inserted in the wind blade slit 1100 and pops up from the particle removing cassette 1060 when needed and is substantially concealed within the particle removing cassette 1060 when not in use. A controller 70 selectively enables an adjustable angle portion of the directional positioner 1170 in some embodiments. The adjustable angle portion includes a body that is slideably received within the processing apparatus 10 and has an inwardly projecting annular flange which bears against any appropriate type of sealing.

In certain embodiments, the directional positioner 1170 is a 3-axis rotational device, and as it rotates in a certain direction, the wind blade slit 1100 attached to the directional positioner 1170 is moved to a cleaning position.

In some embodiments, the controller 70 is configured to monitor debris particles 119 on the mask by a monitoring device 1420, adjust a flow and a pressure of the pressurized cleaning material by the pump when an amount of debris particles 119 in the mask is more than a threshold amount or greater than a threshold size, and regulate ejecting parameters of the cleaning material, such as nitrogen, by operating a compressor and the pump when the pressurized nitrogen is ejected from the wind blade slit. In some embodiments, the monitoring device is a camera. In some embodiments, the ejection of the pressurized nitrogen from the wind blade slit is stopped when the monitoring device detects the amount of the debris particles on the mask is below the threshold amount. Any appropriate controlling configuration regarding automatic and/or manual operation is contemplated and is not limited in this regard. In some embodiments, the cleaning material includes nitrogen and other inert gases such as argon.

The cleaning position of the particle removing cassette with respect to the surface 120 of the mask 14 is programmed by the controller 70 according to different cleaning modes. For example, the cleaning position may be programmed in a horizontal configuration relative to the processing apparatus 10. After positioning the wind blade slit 1100 to the cleaning position (e.g., the horizontal configuration relative to the processing apparatus 10), the directional positioner 1170 stops moving. The pressurized cleaning material 1080 then cleans the mask 14 until the end of a cleaning time 1070.

Figure 8:
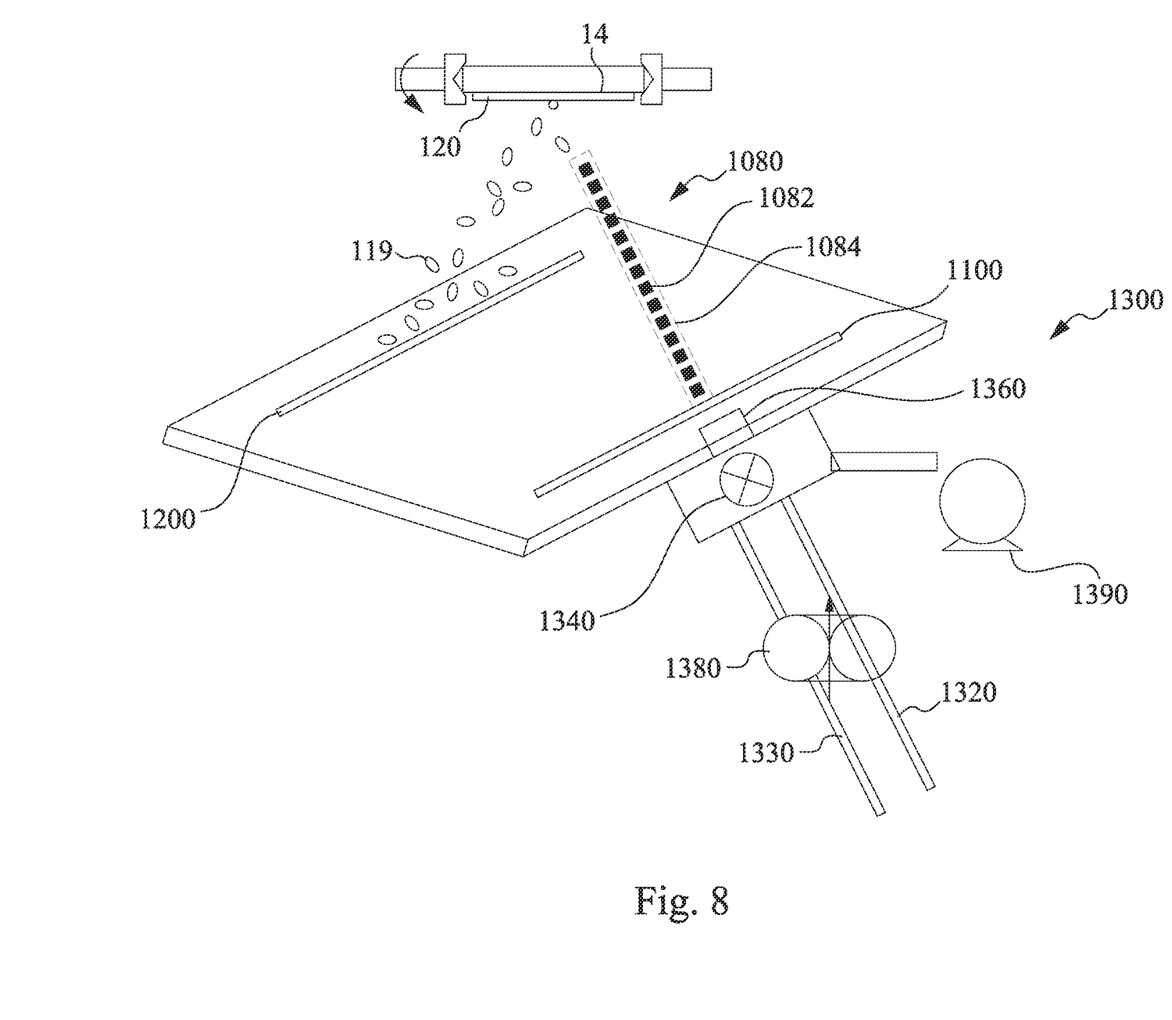
FIG. 8 shows a detailed view of a particle removing assembly according to another embodiment of the disclosure.

As shown in FIG. 8, the supporting member 1300 includes an air inlet 1320, a cleaning material inlet 1330, a mixer 1340, a compressor 1380 and a pump 1390. The compressor 1380 pressurizes air taken in from the air inlet 1320. In some embodiments, the inlets 1320, 1330 and the compressor 1380 are located outside of the processing apparatus.

In some embodiments, the particle removing assembly 1000 further includes the pump 1390 for mixing cleaning material 1082 and the pressurized air stream 1084. The pressurized cleaning material 1080 is ejected from the particle removing assembly 1000, i.e., the wind blade slit 1100, and directed at the mask surface 120. In some embodiments, the pressure of the pressurized cleaning material 1080 is in a range of about 0.3 to about 0.6 Pascal. In some embodiments, a flow rate of the pressurized cleaning material 1080 is in a range of about 15 to about 50 liters per minute (LPM).

The mixer 1340 transports the pressurized cleaning material 1080 via a transfer port 1360 to the wind blade slit 1100. In this cleaning procedure, the wind blade slit 1100 directs the pressurized cleaning material 1080 to the surface 120 of the mask 14 and microscopic shock waves are generated by the cleaning material 1082 causing the debris particles 119 to be removed from the surface 120 of the mask 14. The exhausting slit 1200 collects the debris particles 119 separated from the surface 120 of the mask 14 and the contaminants through an exhaust line 1220. Thereby, the cleaning effect is further enhanced by the microscopic shock waves, and contamination inside the processing apparatus 10 is reduced in some embodiments.

Figure 9A:
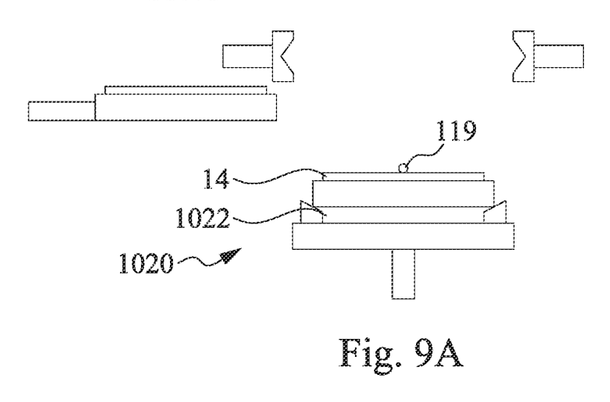
FIGS. 9A, 9B, 9C, 9D, 9E, 9F, 9G, and 9H show a method cleaning a mask for photolithographic apparatus according to an embodiment of the disclosure.
Figure 9B:
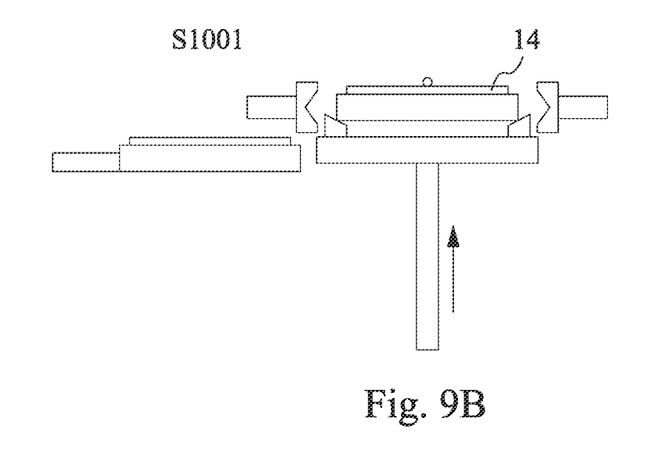
Figure 9C:
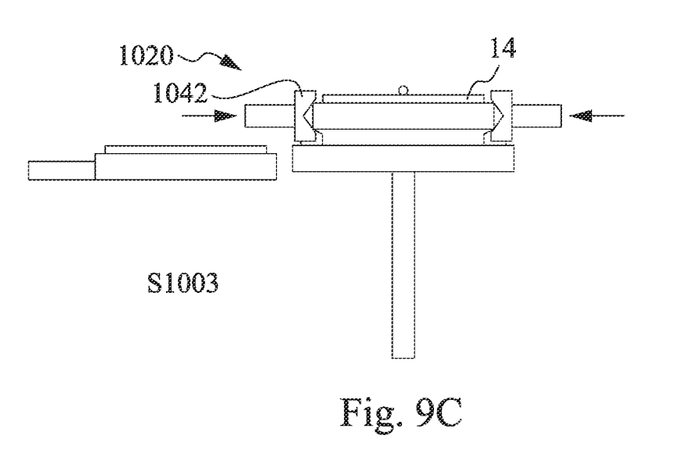
Figure 9D:
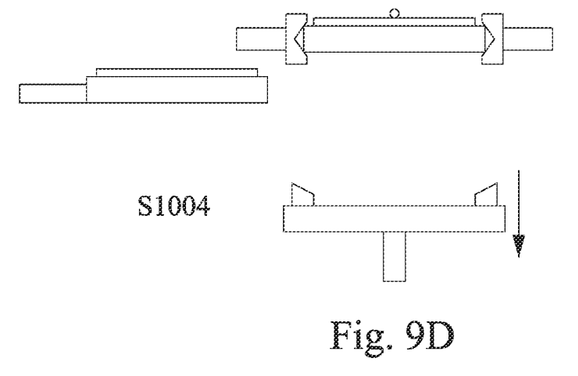
Figure 9E:
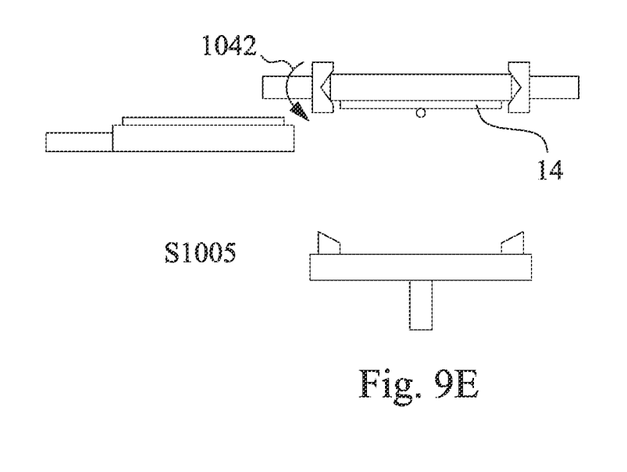
Figure 9F:
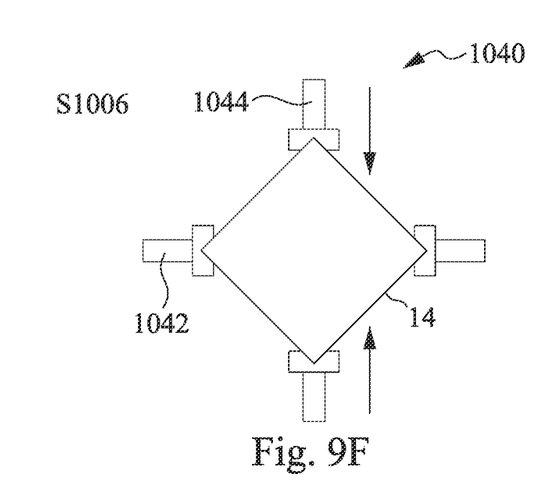
Figure 9G:
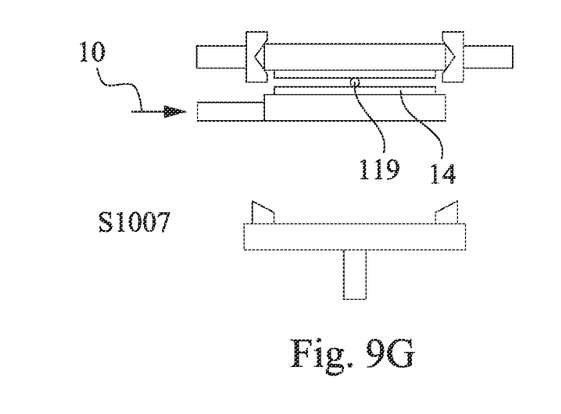
Figure 9H:
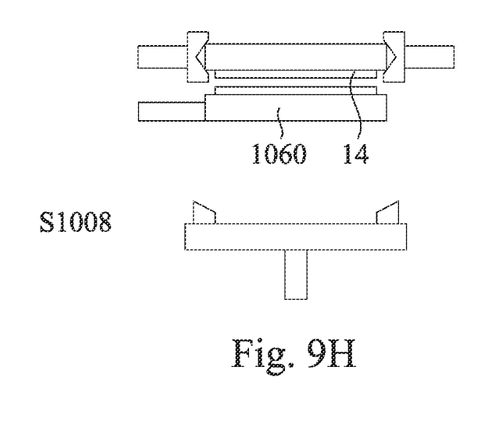

FIGS. 9A-9H show a method of cleaning the mask for an photolithographic apparatus according to an embodiment of the disclosure. FIGS. 9A, 9B, 9C, 9D, 9E, 9G and 9H are cross section views of the photolithographic apparatus and FIG. 9F is a plan view of the photolithographic apparatus. An exemplary cleaning procedure according to embodiments of the disclosure is as follows: in operation S1001 as shown in FIG. 9A, the electrostatic chuck 1022 of the chuck assembly 1020 holds the mask 14 where the debris particles 119 are disposed thereon. In operation S1002 as shown in FIG. 9B, the chuck assembly 1020 transports the mask 14 to a cleaning location by lifting the mask 14 up. In operation S1003 as shown in FIG. 9C, the flipper 1042 of the holding and flipping member 1040 catches and holds the mask 14. In operation S1004 as shown in FIG. 9D, the chuck assembly 1020 moves down. In operation S1005 as shown in FIG. 9E, the flipper 1042 of the holding and flipping member 1040 flips the mask 14 so that the mask 14 is facing downwards. FIG. 9F is a plan view showing two holding and flipping members 1040 securing the mask 14 in operation S1006. In operation S1007 as shown in FIG. 9G, the particle removing cassette 1060 extends from the processing apparatus 10 to be positioned in the debris removing location. In operation S1008 as shown in FIG. 9H, the debris particles are removed from the mask 14 by the particle removing cassette 1060 using pressurized cleaning material and a vacuum according to the embodiments disclosed herein.

Embodiments of the present disclosure provide cleaner masks with reduced contamination. Embodiments of the present disclosure further provide the benefit of reducing downtime during maintenance and servicing photolithographic tools and masks. The design of the cleaning system and particle removing cassette allows for faster maintenance with reduced servicing time. The adaptation of the cleaning system allows an improved process resulting in reduced manpower required to perform the maintenance, and an increased output of conforming servicing items of the photolithographic tools—both of which ultimately result in a cost-savings. As such, the photolithographic tools and masks are more efficiently used. However, it will be understood that not all advantages have been necessarily discussed herein, no particular advantage is required for all embodiments or examples, and other embodiments or examples may offer different advantages.

An embodiment of the disclosure is a method of cleaning a mask for a photolithographic apparatus, in which the photolithographic apparatus comprises a particle removing cassette that is selectively extendable from the photolithographic apparatus and having a wind blade slit, an exhaust slit and a supporting member. First, a patterning surface of the mask is positioned facing down along a direction of gravity. Subsequently, the method ejects the pressurized cleaning material from the supporting member through the wind blade slit toward debris particles on the patterning surface of the mask. The method then removes the debris particles from the mask. Finally, the method collects the debris particles and contaminants. In some embodiments, the cleaning method includes positioning the wind blade slit with respect to the debris particles by an extendable positioner. In some embodiments, the cleaning method oscillates the pressure of the pressurized nitrogen. In some embodiments, the cleaning method monitors the debris particles on the mask. In such embodiments, the method then adjusts a flow and a pressure of the pressurized cleaning material by a pump and a compressor when an amount of the debris particles in the mask is more than a threshold amount or greater than a threshold size. In such embodiments, the method regulates the operating parameters of the pump and the compressor. In some embodiments, a pulsation insert is inserted into the wind blade slit to generate a pulsation of the pressurized cleaning material. In some embodiments, an directional positioner is inserted into the wind blade slit to change a three-dimensional rotation of the pressurized cleaning material. In some embodiments, a distance between the particle removing cassette and the patterning surface of the mask is in a range from 0.8 mm to 1.2 mm. In some embodiments, a distance between the wind blade slit and the exhaust slit is in a range from 8 mm to 12 mm.

Another embodiment of the disclosure is a cleaning system for a photolithographic apparatus that includes a mask, a particle removing cassette and a chamber enclosing the mask and the particle removing cassette and a controller communicating with the particle removing cassette. The particle removing cassette includes a blowing device, an exhausting device, and a supporting device. In some embodiments, the particle removing cassette includes a monitoring device for monitoring debris particles on the mask. In some embodiments, the blowing device includes an air inlet, a nitrogen inlet, a mixer and a wind blade slit. In some embodiments, the wind blade slit includes a pulsation insert and a directional insert. In some embodiments, the supporting member includes a compressor. In some embodiments, the supporting member includes a pump. In some embodiments, the blowing member includes an extendable positioner. In some embodiments, the photolithographic apparatus includes a controller configured to monitor debris particles on a surface of the mask. In such embodiment, the photolithographic apparatus then adjusts a flow and a pressure of the pressurized cleaning material by the pump when an amount of the debris particles in the mask is more than a threshold amount or greater than a threshold size. In such embodiment, the photolithographic apparatus finally regulates ejecting parameters of the compressor and the pump, when pressurized cleaning material is ejected from the wind blade slit. In some embodiments, a distance between the particle removing cassette and the patterning surface of the mask is in a range from 0.8 mm to 1.2 mm.

Another embodiment of the disclosure is a method of cleaning a mask for a photolithographic apparatus. The method first provides a mask within a chamber. The method then provides a particle removing cassette having a wind blade slit, an exhaust slit and a supporting member inside the chamber. Then method then forms pressurized cleaning material including nitrogen and a pressurized air stream from the supporting member. Then, the method ejects the pressurized cleaning material through an array of wind blade nozzles spaced apart within the wind blade slit toward the debris particles at the patterning surface of the mask. The method removes the debris particles from the mask, and finally, collects the debris particles and contaminants by an array of exhaust lines spaced apart within the exhausting slit.

In some embodiments, the cleaning method further regulates the cleaning using a controller. In such embodiment, the controller is configured to monitor the debris particles on the mask, and compare an amount of the debris particles on the mask with a threshold amount to remove the debris particles by the pressurized cleaning material. In some embodiments, the cleaning method stops the ejecting the pressurized cleaning material when the amount of the debris particles on the mask is below the threshold amount.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning method of a mask for a photolithographic apparatus, the photolithographic apparatus comprising a particle removing cassette having a first slit and an elongated wind blade nozzle extending along a length of the first slit and protruding from the first slit, the method comprising:
   ejecting pressurized cleaning material through the elongated wind blade nozzle of the first slit toward debris particles on a patterning surface of the mask to remove the debris particles from the patterning surface of the mask, wherein the patterning surface of the mask is positioned facing down along a direction of gravity; and
   adjusting a flow rate and a pressure of the pressurized cleaning material by a pump and a compressor based on an amount of the debris particles on the patterning surface of the mask.

2. The cleaning method of claim 1, further comprising positioning the elongated wind blade nozzle with respect to the debris particles by an extendable positioner.

3. The cleaning method of claim 1, further comprising regulating operating parameters of the pump and the compressor based on the amount of the debris particles on the patterning surface of the mask.

4. The cleaning method of claim 1, further comprising:
   three-dimensionally rotating the pressurized cleaning material ejected from the elongated wind blade nozzle of the first slit using a directional positioner inserted into the first slit; and
   directing, by the rotating, the pressurized cleaning material to one or more debris particles on the patterning surface of the mask.

5. The cleaning method of claim 4, wherein the particle removing cassette further comprises an elongated exhaust line extending along a length of a second slit, the method further comprising:
   collecting the debris particles removed from the patterning surface of the mask by the elongated exhaust line of the second slit.

6. The cleaning method of claim 1, further comprising positioning the patterning surface of the mask facing down along a direction of gravity.

7. The cleaning method of claim 1, further comprising monitoring the amount of the debris particles on the patterning surface of the mask.

8. The cleaning method of claim 1, further comprising obtaining the amount of the debris particles on the patterning surface of the mask from an outside source.

9. A particle removing cassette, comprising:
   a first slit; and
   an array of parallel wind blade nozzles arranged along a length of the first slit and protruding from the first slit, and configured to eject pressurized cleaning material and direct the pressurized cleaning material to a patterning surface of a mask in a chamber of a photolithographic apparatus to remove debris particles on the patterning surface,
   wherein the patterning surface of the mask is positioned facing down along a direction of gravity, and
   the array of parallel wind blade nozzles protrudes out of the particle removing cassette toward the patterning surface of the mask.

10. The particle removing cassette of claim 9, wherein a distance between the particle removing cassette and the patterning surface of the mask is in a range from 0.8 mm to 1.2 mm.

11. The particle removing cassette of claim 9, further comprising:
    a pulsation insert mounted in the first slit and configured to oscillate a pressure of the ejected pressurized cleaning material; and
    a directional positioner mounted in the first slit and configured to provide a three-dimensional rotation of the ejected pressurized cleaning material.

12. The particle removing cassette of claim 11, wherein the directional positioner is configured to move the array of two or more parallel wind blade nozzles to direct the ejected pressurized cleaning material toward the debris particles and contaminations on the patterning surface of the mask.

13. The particle removing cassette of claim 9, wherein the array of two or more parallel wind blade nozzles comprises between 5 to 7 nozzles.

14. The particle removing cassette of claim 9, further comprising an extendable positioner configured to move the array of parallel wind blade nozzles with respect to the debris particles on the patterning surface of the mask.

15. A photolithographic apparatus, comprising:
    a particle removing cassette comprising a first slit comprising an array of parallel wind blade nozzles arranged along a length of the first slit, protruding from the first slit, and configured to eject and direct pressurized cleaning material to a patterning surface of a mask to remove debris particles on the patterning surface; and
    a pump and a compressor controlled by a controller, and configured to adjust a flow rate and a pressure of the pressurized cleaning material based on an amount of debris particles on the patterning surface of the mask.

16. The photolithographic apparatus of claim 15, wherein the particle removing cassette further comprises a second slit comprising an elongated exhaust line extending along a length of the second slit and configured to collect the debris particles removed from the patterning surface of the mask.

17. The photolithographic apparatus of claim 15, wherein a distance between the particle removing cassette and the patterning surface of the mask is in a range from 0.8 mm to 1.2 mm.

18. The photolithographic apparatus of claim 15, further comprising a directional positioner inserted into the first slit to change a three-dimensional rotation of the pressurized cleaning material.

19. The photolithographic apparatus of claim 15, wherein the particle removing cassette further comprises a monitoring device for monitoring debris particles on the mask.

20. The particle removing cassette of claim 9, further comprising an exhausting slit including an array of exhaust lines within the exhausting slit.

* * * * *